United States Patent
Higashino et al.

(10) Patent No.: US 8,678,565 B2
(45) Date of Patent: Mar. 25, 2014

(54) ELECTROMECHANICAL TRANSDUCER

(75) Inventors: Kusunoki Higashino, Osaka (JP); Shinya Matsuda, Takarazuka (JP)

(73) Assignee: Konica Minolta Holdings, Inc., Tokyo (JP)

( * ) Notice: Subject to any disclaimer, the term of this patent is extended or adjusted under 35 U.S.C. 154(b) by 0 days.

(21) Appl. No.: 13/697,994

(22) PCT Filed: Apr. 27, 2011

(86) PCT No.: PCT/JP2011/060220
§ 371 (c)(1),
(2), (4) Date: Nov. 14, 2012

(87) PCT Pub. No.: WO2011/142256
PCT Pub. Date: Nov. 17, 2011

(65) Prior Publication Data
US 2013/0063530 A1  Mar. 14, 2013

(30) Foreign Application Priority Data
May 14, 2010  (JP) .................. 2010-111866

(51) Int. Cl.
*B41J 2/045* (2006.01)
(52) U.S. Cl.
USPC ................. 347/70; 347/68; 347/71
(58) Field of Classification Search
USPC ................. 347/70–72, 68
See application file for complete search history.

(56) References Cited

U.S. PATENT DOCUMENTS

| | | |
|---|---|---|
| 2002/0051040 A1 | 5/2002 | Shimada et al. |
| 2003/0215342 A1 | 11/2003 | Higashino et al. |
| 2006/0284940 A1* | 12/2006 | Katayama ............ 347/72 |
| 2007/0046737 A1 | 3/2007 | Sugahara |
| 2007/0090725 A1 | 4/2007 | Kamiyama et al. |
| 2008/0239024 A1 | 10/2008 | Sugahara |

FOREIGN PATENT DOCUMENTS

| | | | |
|---|---|---|---|
| JP | 9-118011 | 5/1997 | |
| JP | 3168474 | 5/2001 | |
| JP | 2002-120369 | 4/2002 | |
| JP | 2004-183495 | 7/2004 | |
| JP | 2006-347123 | 12/2006 | |
| JP | 2007-90868 | 4/2007 | |
| JP | 2007-143125 | 6/2007 | |
| JP | 2007-225438 | 9/2007 | |
| JP | 2008-273192 | 11/2008 | |
| WO | WO 2012-144305 | * 3/2012 | ............ B41J 2/045 |

* cited by examiner

*Primary Examiner* — Henok Legesse
(74) *Attorney, Agent, or Firm* — Cozen O'Connor

(57) ABSTRACT

An electromechanical transducer (1) has a pressurizing chamber (21) and a side-chamber (23) formed in a plate (11). On a driven film (13) forming the upper wall surface (21*a*) of the pressurizing chamber (21) and the side-chamber (23), a lower electrode (33), a driving member, and an upper electrode (35) are formed in this order. The driving member is composed of an operation section (31*p*) located over the pressurizing chamber (21), and an extended section (31*a*) extending from the operation section (31*p*) to over the side-chamber (23). The side-chamber (23) has a smaller width than the pressurizing chamber (21) in a second direction perpendicular to a first direction in which the side-chamber (23) is located beside the pressurizing chamber (21). The extended section (31*a*) of the driving member has a smaller width than the side-chamber (23) in the second direction.

15 Claims, 12 Drawing Sheets

ELECTROMECHANICAL TRANSDUCER

RELATED APPLICATIONS

This is a U.S. National Phase Application under 35 USC 371 of International Application PCT/JP2011/060220 filed on Apr. 27, 2011.

This application claims the priority of Japanese application no. 2010-111866 filed May 14, 2010, the entire content of which is hereby incorporated by reference.

TECHNICAL FIELD

The present invention relates to an electromechanical transducer, and more particularly to an electromechanical transducer having a diaphragm structure.

BACKGROUND ART

Electromechanical transducers having a cantilever (a beam supported at one end) structure are known that have a thin film of a piezoelectric material formed on a plate. They permit efficient conversion of expansive-contractive deformation along the plane of the thin film into a displacement in the direction perpendicular to the plane, and thus allow the building of highly sensitive sensors and actuators. Inconveniently, however, since one end of the beam is loose, they are not very rigid and are prone to be deformed and twisted under external forces.

As solutions, different improvements have been proposed to increase the rigidity of the displacement film, such as a portal (a beam supported at both ends) structure where the displacement film is held at opposite ends and a diaphragm structure where the displacement film is held around its edge. This increases the rigidity of the displacement film, and leads to the following advantages: the generated force is increased; deformation occurs stably under external forces; a central part of the displacement film can be moved parallel to the plate; the hermetic structure allows application in pumps for transporting gas and liquid; etc.

On the other hand, ink-jet printers are known that are provided with a plurality of channels for jetting out liquid ink and that control the jetting of ink while moving relative to a recording medium such as paper and cloth so as to thereby output two-dimensional images. For fast image formation on such printers, a line-head system is preferable in which scanning is performed in one direction with channels arranged across the entire width of the recording medium.

With a line-head system, to reduce the cost of the head and achieve high resolution, it is preferable to make the channels as small as possible and arrange small channels two-dimensionally in the head with high density. As a method of making channels small and increase their density, Patent Document 1 listed below proposes a method in which square channels are arranged in a staggered formation.

On the other hand, Patent Documents 2 and 3 listed below disclose ink-jet-type recording heads in which a piezoelectric member held between a lower and an upper electrode is provided over an elongate pressurizing chamber. In these ink-jet-type recording heads, the piezoelectric member and the upper electrode are extended in the length direction of the pressurizing chamber to lead out wiring for electrical connection.

LIST OF CITATIONS

Patent Literature

Patent Document 1: Japanese Patent No. 3168474
Patent Document 2: Japanese Patent Application Published as No. H9-118011
Patent Document 3: Japanese Patent Application Published as No. JP-2002-120369

SUMMARY OF INVENTION

Technical Problem

Inconveniently, however, with the methods disclosed in Patent Documents 2 and 3, when the piezoelectric member is driven, stress concentrates on the extended sections of the piezoelectric member and of the upper electrode in a peripheral part of the pressurizing chamber, and the extended section may be destroyed.

The present invention has been devised against the background discussed above, and aims to provide an electromechanical transducer that can prevent destruction of extended sections of a driving member such as a piezoelectric member and of an upper electrode.

Solution to Problem

According to one aspect of the present invention, an electromechanical transducer includes: a plate; a pressurizing chamber formed in the plate and having a cross-sectional shape with an aspect ratio of approximately one to one in directions parallel to the plane of the plate; a side-chamber formed in the plate, communicating with the pressurizing chamber, and provided beside the pressurizing chamber in a first direction parallel to the plane of the plate; a driven film formed on one face of the plate with a smaller thickness than the plate so as to form an upper wall surface of the pressurizing chamber and the side-chamber; a lower electrode formed on the driven film; a driving member formed on the lower electrode and composed of an operation section located over the pressurizing chamber, smaller than the cross-sectional shape of the pressurizing chamber, and having an aspect ratio of approximately one to one in the directions parallel to the plane of the plate, and an extended section extending from the operation section to over the side-chamber; and an upper electrode formed on the driving member. Here, the side-chamber has a smaller width than the pressurizing chamber in a second direction perpendicular to the first direction and parallel to the plane of the plate, and the extended section of the driving member has a smaller width than the side-chamber in the second direction.

According to another aspect of the present invention, an electromechanical transducer includes: a plate; a pressurizing chamber formed in the plate and having a cross-sectional shape with an aspect ratio of approximately one to one in directions parallel to the plane of the plate; a first side-chamber formed in the plate, communicating with the pressurizing chamber, and provided beside the pressurizing chamber in a first direction parallel to the plane of the plate; a second side-chamber formed in the plate, communicating with the pressurizing chamber, provided beside the pressurizing chamber in the first direction parallel to the plane of the plate, and arranged opposite the first side-chamber across the pressurizing chamber; a driven film formed on one face of the plate with a smaller thickness than the plate so as to form an upper wall surface of the pressurizing chamber, the first side-chamber, and the second side-chamber; a lower electrode formed on the driven film; a driving member formed on the lower electrode; a first upper electrode having a first electrode operation section formed on the driving member over the pressurizing chamber, smaller than the cross-sectional shape of the pressurizing chamber, and having an aspect ratio of approximately one to one in the directions parallel to the plane of the plate, and a first electrode extended section extending from the first electrode operation section to over the driving member over the first side-chamber; a second upper electrode having a second electrode operation section formed on the driving member over the rim of the pressurizing chamber and formed so as to surround the first upper electrode, and a second electrode extended section extending from the second electrode operation section to over the driving member over the second side-chamber; and a drive circuit for feeding drive signals of opposite polarities to the first and second upper electrodes. Here, the first and second side-chambers have a smaller width than the pressurizing chamber in a second direction perpendicular to the first direction and parallel to the plane of the plate, and the first and second electrode extended sections of the first and second upper electrodes respectively have a smaller width than the first and second side-chambers in the second direction.

Advantageous Effects of the Invention

According to the present invention, it is possible to provide an electromechanical transducer that, while preventing destruction of extended sections of a driving member such as a piezoelectric member and of an upper electrode, allows wiring to be led out from the upper electrode

DESCRIPTION OF EMBODIMENTS

Prior to a description of embodiments of the present invention, a reference example for clarifying the existing problems will be described with reference to FIGS. 11 and 12. Among different diagrams, identical or equivalent parts are identified by common reference signs and no overlapping description will be repeated unless necessary.

Figure 11A:
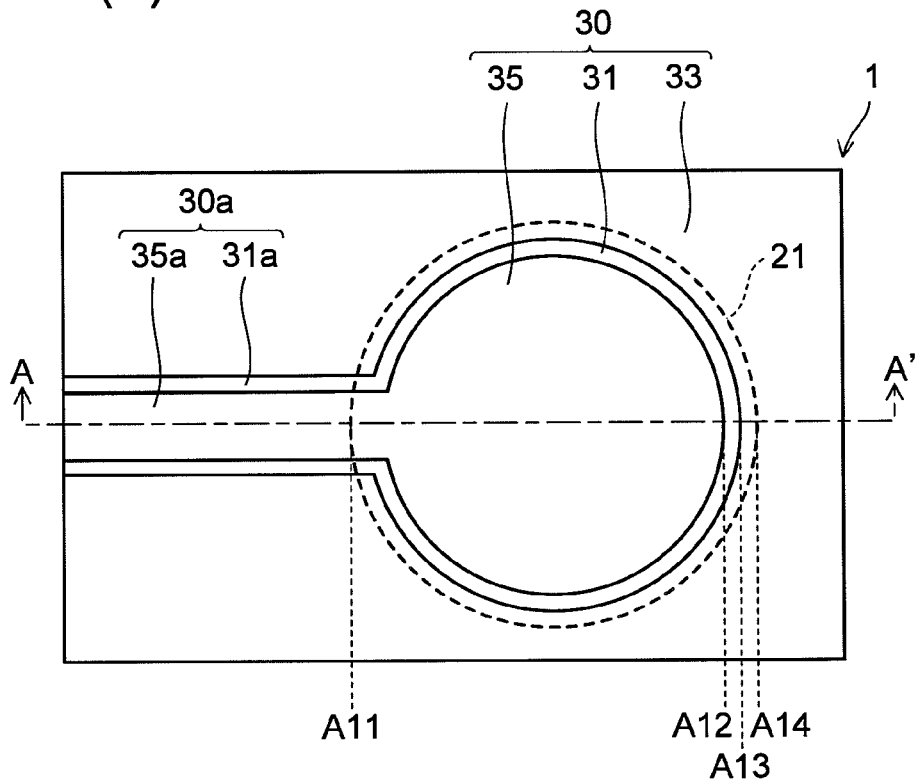
FIG. 11(a) is a plan view schematically showing the structure of a diaphragm-type electromechanical transducer of a reference example.
Figure 11B:
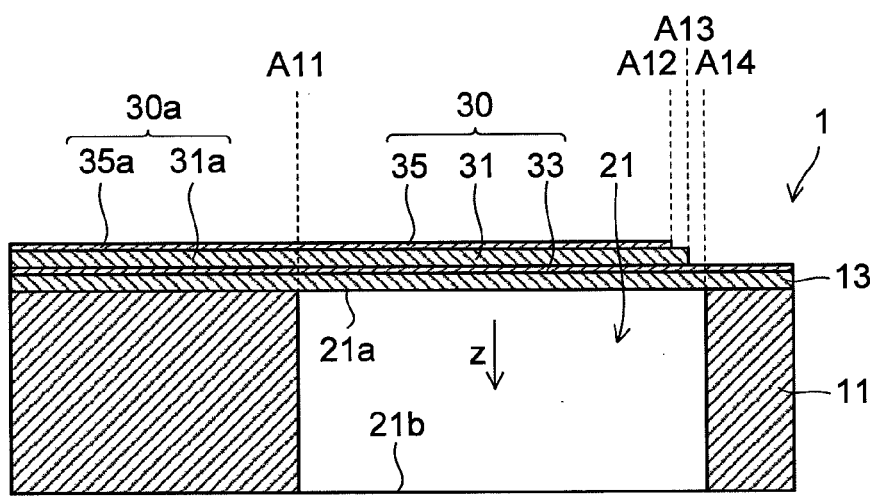
FIG. 11(b) is a sectional view along line A-A' in FIG. 11(a)
Figure 12A:
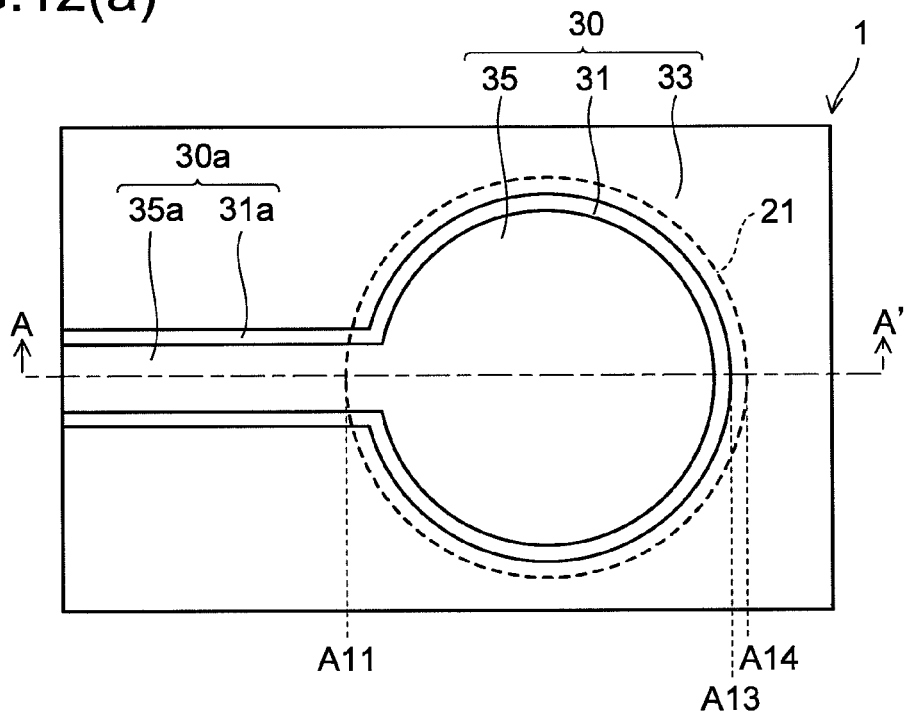
FIG. 12(a) is a plan view of the electromechanical transducer of the reference example.
Figure 12B:
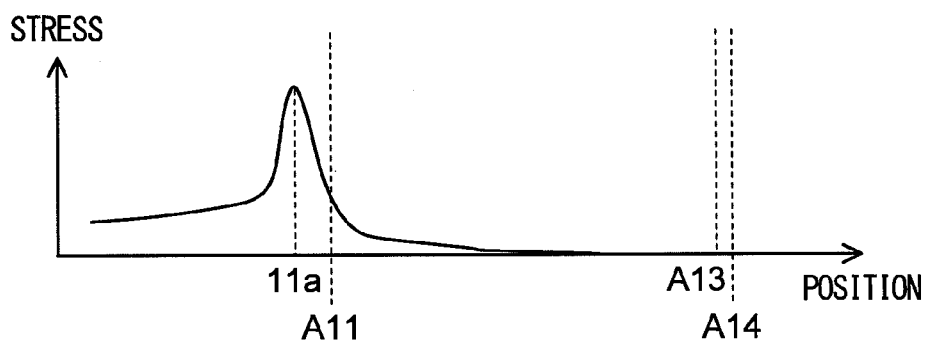
FIG. 12(b) is a plot showing the relationship between position and stress in the electromechanical transducer.
Figure 12C:
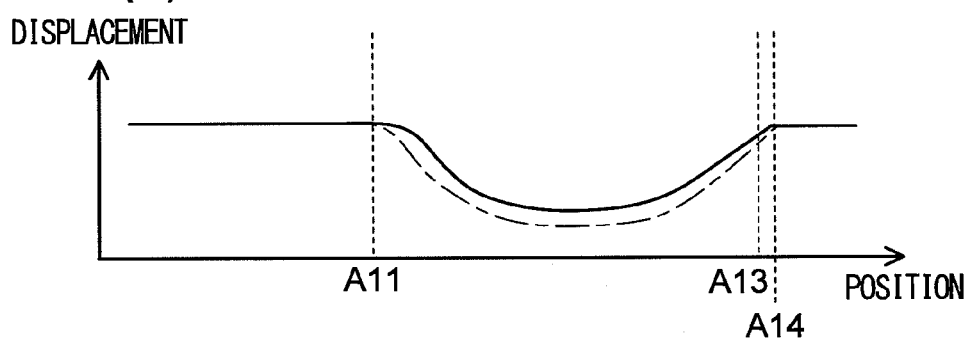
FIG. 12(c) is a plot showing the relationship between position and displacement in the electromechanical transducer.

FIG. 11 is a schematic diagram showing the structure of a diaphragm-type electromechanical transducer as a reference example, FIG. 11(a) being a plan view and FIG. 11(b) being a sectional view along line A-A' in FIG. 11(a) as seen from the direction of arrows. FIG. 12 is a schematic diagram showing the characteristic curve of the diaphragm-type electromechanical transducer of the reference example, FIG. 12(a) being the same plan view as FIG. 11(a), FIG. 12(b) being a plot of the stress occurring during driving, and FIG. 12(c) being a plot of the displacement during driving. Positions A11 to A14 in the plan view correspond respectively to positions A11 to A14 in the sectional view.

In FIG. 11, the electromechanical transducer 1 is composed of a cylindrical pressurizing chamber 21 formed in a plate 11, a driven film 13 formed on one face of the plate 11 and serving as a wall surface 21a at the top of the pressurizing chamber 21, and a driving film 30 formed on the driven film 13. The driving film 30 is composed of a piezoelectric member 31 of, for example, lead zirconate titanate (PZT), an upper electrode 35 provided on the piezoelectric member 31, and a lower electrode 33 provided continuously all over the surface between the driven film 13 and the piezoelectric member 31. The pressurizing chamber 21 has, in the face opposite from the wall surface 21a, an opening 21b.

When a voltage from outside is applied between the lower and upper electrodes 33 and 35, and as a result the piezoelectric member 31 expands and contracts in the planar direction, its difference in length from the driven film 13 produces a curvature, and thus produces a displacement in the direction (indicated by arrow z) perpendicular to the planar direction of the driving film 30. By exploiting this displacement, it is possible to make the elctromechanical transducer 1 function as an actuator.

Conversely, when a pressure from outside acts on the driven film 13 and the driving film 30, a curvature is produced and a pressure acts on the driving film 30, producing an electric field in the piezoelectric member 31 through the piezoelectric effect. By detecting via the lower and upper electrodes 33 and 35 the amplitude, period, and phase of the electric field produced in the piezoelectric member 31, it is possible to make the elctromechanical transducer 1 function as a pressure sensor.

To improve the conversion efficiency of the elctromechanical transducer 1, it is preferable to make the piezoelectric member 31 smaller than the wall surface 21a at the top of the pressurizing chamber 21. If the piezoelectric member 31 is larger than the wall surface 21a and extends to over a peripheral part of the plate 11, it hampers the expansion and contraction of the driving film 30.

However, making the piezoelectric member 31 smaller than the wall surface 21a makes it difficult to lead out the upper electrode 35. The driving film 30 is as thin as several micrometers and brittle, and therefore does not withstand the pressure during wiring such as wire-bonding or tension after connection. Moreover, the displacement of the driving film 30 is perpendicular to the planar direction, and the wiring hampers the displacement. That is, it is difficult to connect a wire, or bond an electrode terminal, directly to the top of the driving film 30.

To solve this problem, in FIG. 11, parts of the piezoelectric member 31 and the upper electrode 35 are made to extend in narrow strips, so as to be led out right over the wall surface 21a at the top of the pressurizing chamber 21. As an extended section 30a of the driving film 30, a piezoelectric member extended section 31a and an upper electrode extended section 35a are led out from over the wall surface 21a leftward in the diagram.

Inconveniently, with this structure, as shown in FIG. 12(b), when the piezoelectric member 31 is driven, stress concentrates on the extended section 30a in a peripheral part 11a of the wall surface 21a at the top of the pressurizing chamber 21, and this may destroy the extended section 30a. Moreover, the piezoelectric member extended section 31a hampers the displacement of the piezoelectric member 31, and thus, as indicated by a solid line in FIG. 12(c), the displacement of the driving film 30 over the pressurizing chamber 21 becomes asymmetric left to right about the center of the pressurizing chamber 21, and also the amount of displacement is reduced, compared with the ideal displacement indicated by a dash-and-dot line as observed when the extended section 30a is not provided.

In embodiments of the present invention, the problems experienced with the reference example, namely damage to the extended section 30a of the driving film 30 and the reduced amount of displacement, have been solved.

The present invention will now be described by way of embodiments shown in the drawings. This, however, is not meant to limit the present invention to those embodiments.

Figure 1A:
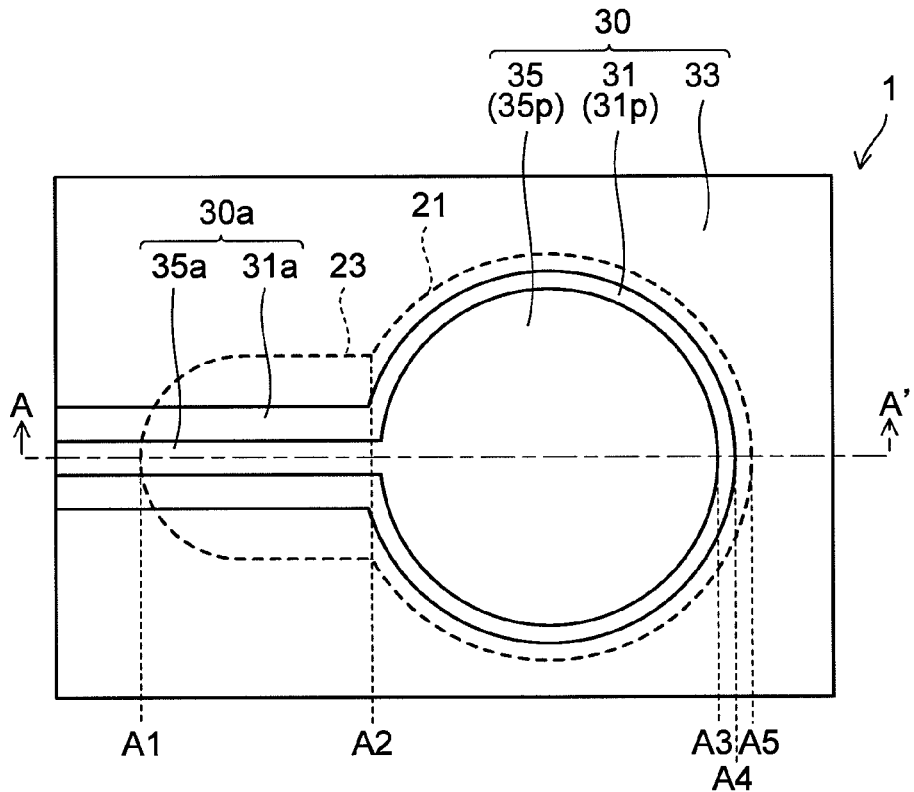
FIG. 1(a) is a plan view showing the structure of an electromechanical transducer according to a first embodiment of the invention.
Figure 1B:
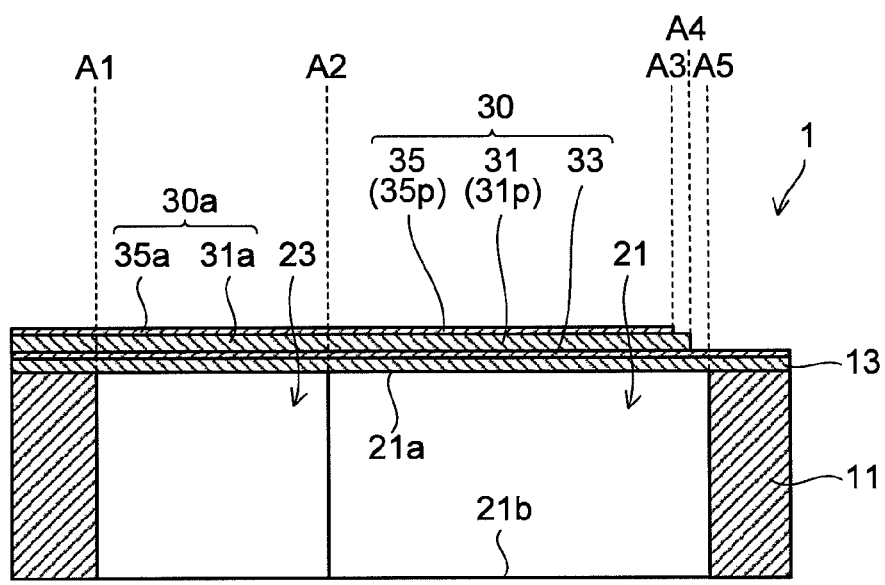
FIG. 1(b) is a sectional view along line A-A' in FIG. 1(a) as seen from the direction indicated by arrows.
Figure 2A:
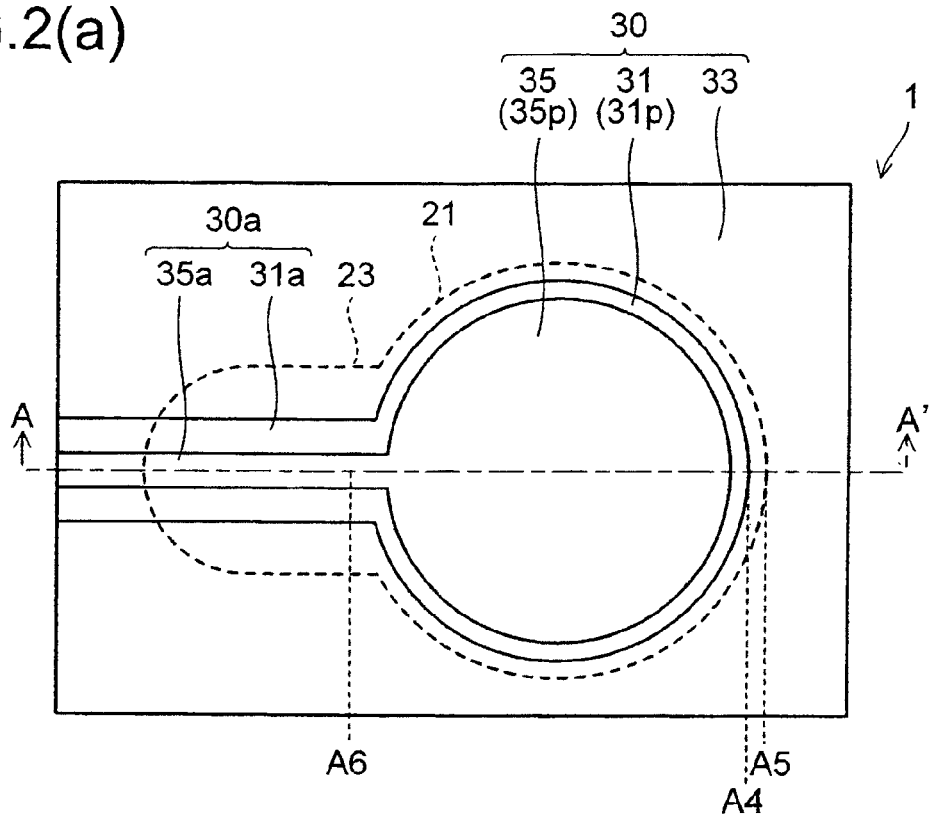
FIG. 2(a) is a plan view of the electromechanical transducer.
Figure 2B:
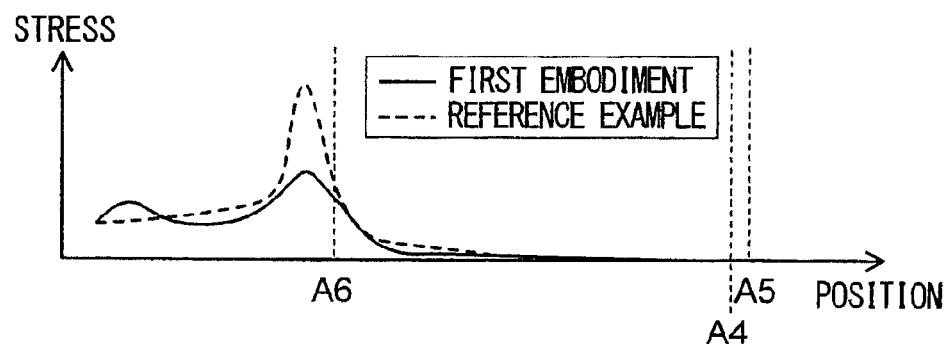
FIG. 2(b) is a plot showing the relationship between position and stress in the electromechanical transducer.
Figure 2C:
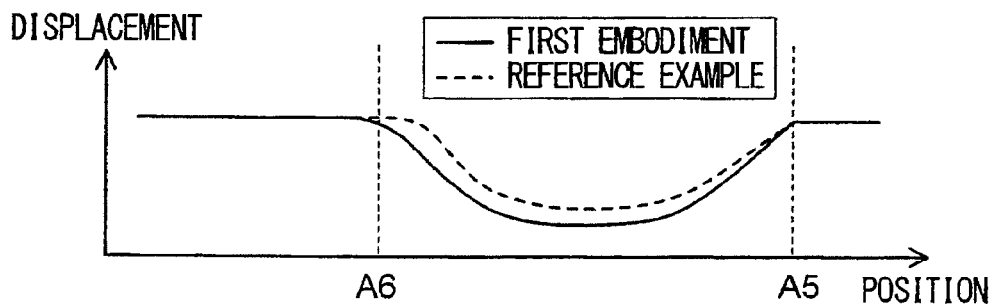
FIG. 2(c) is a plot showing the relationship between position and displacement in the electromechanical transducer.
Figure 3A:
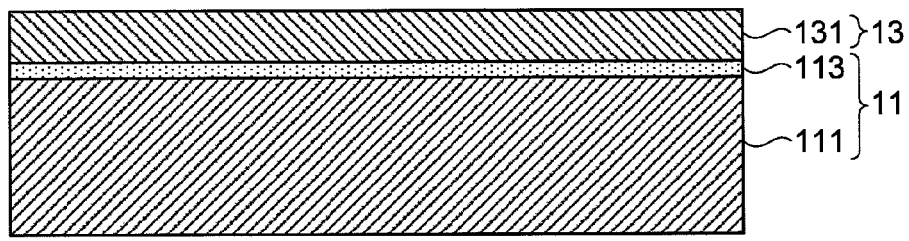
FIG. 3(a) to FIG. 3(d) are sectional views showing a sequence of fabrication steps of the electromechanical transducer.
Figure 3B:
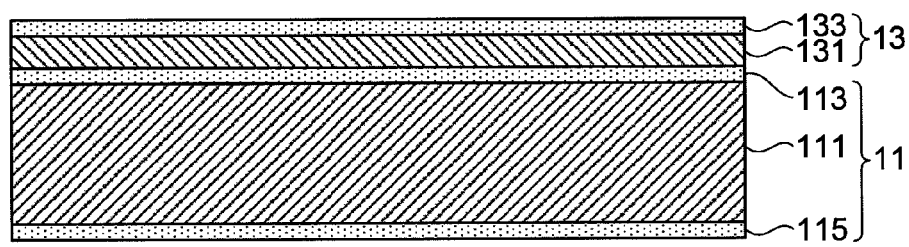
Figure 3C:
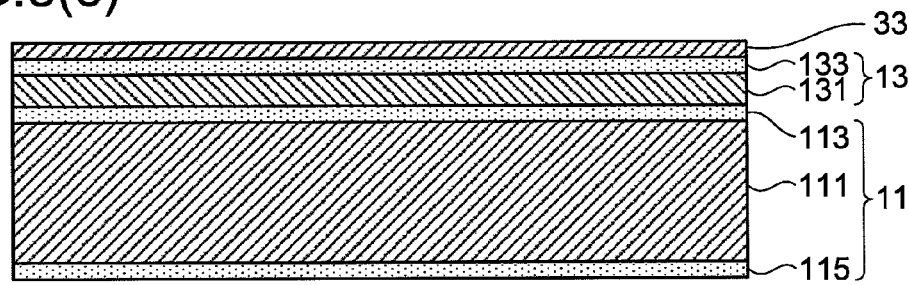
Figure 3D:
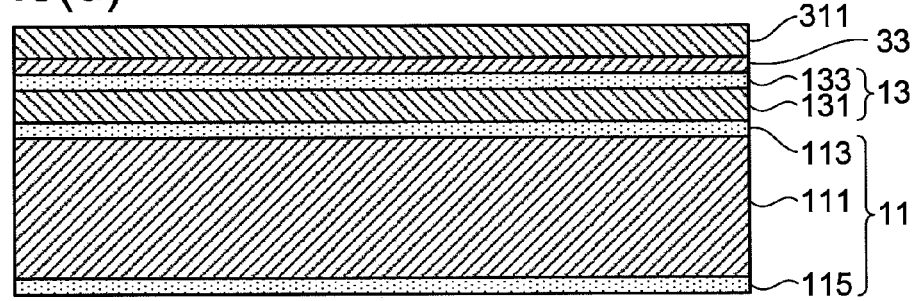

An electromechanical transducer according to a first embodiment of the invention will now be described with reference to FIGS. 1 and 2. FIG. 1 is a schematic diagram showing the structure of the electromechanical transducer according to the first embodiment, FIG. 1(a) being a plan view and FIG. 1(b) being a sectional view along line A-A' in FIG. 1(a) as seen from the direction of arrows. FIG. 2 is a schematic diagram showing the characteristic curve of the electromechanical transducer according to the first embodiment, FIG. 2(a) being the same plan view as FIG. 1(a), FIG. 2(b) being a plot of the stress occurring during driving, and FIG. 2(c) being a plot of displacement during driving. Positions A1 to A6 in the plan view correspond respectively to positions A1 to A6 in the sectional view.

FIGS. 1 and 2 show an electromechanical transducer for a single channel; in a case where an electromechanical transducer array having a plurality of channels is built, a plurality of electromechanical transducers 1 may be arranged in a one-dimensional or two-dimensional array as necessary.

In FIG. 1, the eltromechanical transducer 1 is composed of a plate 11, a pressurizing chamber 21, a side-chamber 23, a driven film 13, a driving film 30, an extended section 30a of the driving film 30, etc.

The pressurizing chamber 21 here is, like the pressurizing chamber 21 of the reference example shown in FIG. 11, a cylindrical space provided in the plate 11. In this embodiment, the sectional shape of the pressurizing chamber 21 in the planar direction parallel to the plane of the plate 11 is circular. Giving it a circular sectional shape allows the driving film 30 to be displaced most effectively. However, the sectional shape of the pressurizing chamber 21 in the planar direction parallel to the plane of the plate 11 is not limited to circular; it may instead be rectangular or polygonal so long as the aspect ratio (the ratio of the dimensions in the up/down and left/right directions in FIG. 1(a)) is approximately one to one.

The side-chamber 23 is a space formed in the plate 11 so as to communicate with the pressurizing chamber 21, and is provided so as to be located beside the pressurizing chamber 21 in a first direction (the left/right direction in the figure) parallel to the plane of the plate 11. The width and length of the side-chamber 23 are about one-half of the cross-sectional diameter of the pressurizing chamber 21. Specifically, as indicated by a broken line in FIG. 1(a), the width of the side-chamber 23 in the up/down direction in the figure is about one-half of the diameter of the pressurizing chamber 21. And the length of the side-chamber 23 in the left/right direction in the figure (in the direction in which the extended section 30a extends) is also about one-half of the diameter of the pressurizing chamber 21. It is preferable that the width of the side-chamber 23 in the up/down direction (a second direction) in the figure be smaller than the diameter of the pressurizing chamber 21 and be in the range of 25% to 75% of the diameter of the pressurizing chamber 21. On the other hand, the length of the side-chamber 23 in the left/right direction (the first direction) in the figure does not necessarily have to be smaller than the diameter of the pressurizing chamber 21 as in this embodiment. It should be noted that in this embodiment, wherever a range is mentioned with respect to a value, the range is inclusive of the upper and lower limits.

The driving film 30 includes, like the driving film 30 of the reference example shown in FIG. 11, a piezoelectric member 31 of PZT or the like and a lower electrode 33 and an upper electrode 35 provided on the top and bottom, respectively, of the piezoelectric member 31. The lower electrode 33 is provided continuously all over the top face of the driven film 13. The piezoelectric member 31 has an operation section 31p smaller than the cross-sectional shape of the wall surface 21a at the top of the pressurizing chamber 21 and having a planar shape with an aspect ratio of approximately one to one in the direction parallel to the plane of the plate 11. As shown in FIG. 1(a), the shape of the operation section 31p of the piezoelectric member 31 is circular, concentric with the circle which is the cross section of the pressurizing chamber 21, with a smaller diameter than the cross section of the pressurizing chamber 21. It is preferable that the size (diameter) of the operation section 31p of the piezoelectric member 31 be 70% to 99% of the size of the cross section of the pressurizing chamber 21, a further preferable range being 90% to 99%.

The upper electrode 35 has an operation section 35p made smaller than the shape of the operation section 31p of the piezoelectric member 31. The shape of the operation section 35p of the upper electrode 35 is circular, concentric with the circle which is the shape of the operation section 31p, with a smaller diameter than the operation section 31p of the piezoelectric member 31. The reason that the upper electrode 35 is made smaller than the piezoelectric member 31 is to reliably prevent the upper electrode 35 from making contact with the lower electrode 33. Thus, the upper electrode 35 does not necessarily have to be made smaller than the piezoelectric member 31; these may be the same size.

An extended section 30a is formed by extending the piezoelectric member 31 and the upper electrode 35 leftward in the figure from over the wall surface 21a at the top of the pressurizing chamber 21 across over the side-chamber 23. The extended section 30a includes a piezoelectric member extended section 31a and an upper electrode extended section 35a formed on it. As shown in FIG. 1(a), with respect to the up/down direction in the figure, the width of the piezoelectric member extended section 31*a* is about one-half of the width of the side-chamber 23, and the width of the upper electrode extended section 35*a* is about one-third of the width of the piezoelectric member extended section 31*a*. It is preferable that the width of the piezoelectric member extended section 31*a* be 50% to 80% of the width of the side-chamber 23. This, however, is not meant to be any limitation, the sole requirement being that the width of the piezoelectric member extended section 31*a* be smaller than the width of the side-chamber 23. It is preferable that the width of the upper electrode extended section 35*a* be 10% to 40% of the width of the piezoelectric member extended section 31*a* (that is, 20% to 50% of the width of the side-chamber 23). This, however, is not meant to be any limitation; the upper electrode extended section 35*a* may be the same size as the piezoelectric member extended section 31*a*.

When a voltage is applied between the lower and upper electrodes 33 and 35 of the driving film 30, the piezoelectric member 31 located over the wall surface 21*a* of the pressurizing chamber 21 expands and contracts, and its difference in length from the driven film 13 produces a curvature, which causes the driving film 30 to be displaced in the direction perpendicular to the planar direction. Here, owing to the provision of the side-chamber 23 under the extended section 30*a*, the stress occurring in the extended section 30*a* is spread, and thus the extended section 30*a* is prevented from being destroyed. In FIG. 2(*b*), the stress occurring in the driving film 30 and the extended section 30*a* in this embodiment is indicated by a solid line. There, the stress in the reference example shown in FIG. 12(*b*) is indicated by a broken line. A comparison reveals that the stress that would otherwise concentrate in a peripheral part 11*a* (see FIG. 12) of the wall surface 21*a* is spread across all over the pressurizing chamber 21 and the side-chamber 23 and is thereby notably reduced.

Since the extended section 30*a* also has the upper electrode extended section 35*a*, the piezoelectric member extended section 31*a* expands and contracts. Making the upper electrode extended section 35*a* of the extended section 30*a* too wide causes the piezoelectric member extended section 31*a* to expand and contract too much, and this may hamper the expansion and contraction of the piezoelectric member 31 located over the pressurizing chamber 21.

To avoid that, in the first embodiment, the upper electrode extended section 35*a* is given a width as small as about one-third of the width of the piezoelectric member extended section 31*a*. As a result, part of the piezoelectric member extended section 31*a* does not expand or contract under the application of a voltage to the upper electrode 35. Moreover, since the extended section 30*a* occupies a smaller area than the driving film 30, the displacement of the piezoelectric member extended section 31*a* is negligibly small.

Rather, the extended section 30*a* as a whole expands and contracts by following the expansion and contraction of the operation section 31*p* of the piezoelectric member 31. Thus, the operation section 31*p* of the piezoelectric member 31 located over the pressurizing chamber 21 is not hampered from expansion and contraction. The piezoelectric member 31 can thus be displaced as much as it should.

In FIG. 2(*c*), a plot of the displacement of the driving film 30 and the extended section 30*a* is indicated by a solid line. The plot shows an approximately rotation-symmetric distribution of displacement about the axis through the center of the pressurizing chamber 21, and reveals improved symmetry and increased amounts of displacement compared with the displacement, indicated by a broken line, in the reference example shown in FIG. 12(*c*).

Giving the upper electrode extended section 35*a* too small a width results in a high electrical resistance, and may cause problems in the aspects of withstand voltage and driving frequency. Thus, it is preferable that the upper electrode extended section 35*a* be given a certain width at least.

Giving the side-chamber 23 a large width results in an increased volume inside the side-chamber 23 into which, when the elctromechanical transducer 1 is driven, the gas or liquid pressed inside pressurizing chamber 21 escapes. This tends to lower the sensitivity of the actuator which the elctromechanical transducer 1 is. On the other hand, giving the side-chamber 23 a small width tends to result in a diminished effect of alleviating the hampering of the expansion and contraction of the driving film 30 and the concentration of stress in the extended section 30*a*. Thus, the width of the upper electrode extended section 35*a*, the width of the side-chamber 23, and other relevant dimensions are determined according to the balance of characteristics required in the elctromechanical transducer 1.

Next, a method of fabricating the electromechanical transducer according to the first embodiment will be described with reference to FIGS. 3 to 6. FIGS. 3 to 6 comprise sectional views schematically showing the fabrication steps in the method of fabricating the electromechanical transducer according to the first embodiment. In these diagrams, the dimensions in the thickness direction (the up/down direction in the figures) are exaggerated for easy recognition of different layers.

In FIG. 3(*a*), the plate 11 and the driven film 13 are formed of a SOI (silicon-on-insulator) plate having two layers of Si bonded together with an oxide film between them as commonly used in micro-electro-mechanical systems (MEMS). The plate portion 111 of Si has a thickness of about 150 μm; the oxide film ($SiO_2$) has a thickness of about 0.1 μm; and the Si film 131, which later becomes the driven film 13, has a thickness of about 2 μm.

The reason that the plate 11 and the driven film 13 are formed of an SOI plate is that, in the later-described formation of the driven film 13, using a hardly etchable oxide film ($SiO_2$) 113 as an etching stop layer helps stabilize the thickness of the driven film 13.

In FIG. 3(*b*), the SOI plate is placed in a furnace and is kept at about 1500° C. for a predetermined length of time so that, on the surface of the top and bottom Si layers, oxide films ($SiO_2$) 133 and 115 are formed respectively. The oxide films ($SiO_2$) 133 and 115 each have a thickness of about 0.1 μm. The driven film 13 is constituted by the Si film 131 and the oxide film ($SiO_2$) 133.

In FIG. 3(*c*), the SOI plate having the oxide films ($SiO_2$) 133 and 115 formed on it is cooled down to room temperature, and then, all over the surface of the SOI plate, a thin titanium Ti layer with a thickness of about 0.02 μm and a platinum Pt layer with a thickness of about 0.1 μm are formed by sputtering as the lower electrode 33. The titanium Ti layer functions as an adhesion layer for enhancing the adhesion between the oxide film ($SiO_2$) 133 and the lower electrode 33.

In FIG. 3(*d*), the SOI plate having the lower electrode 33 formed on it is heated again to about 600° C. so that, by sputtering or the like, all over the surface of the SOI plate, a film 311 of a piezoelectric material such as lead zirconate titanate (PZT) is formed, which later becomes the piezoelectric member 31. The piezoelectric material film 311 has a thickness of about 5 μm.

In the piezoelectric material film 311 formed by sputtering, during film formation, alignment of electrical dipoles, that is, polarization, occurs, and this eliminates the need for an extra process for polarization. In cases where the piezoelectric material film 311 is formed by another method or where a later process involves the use of such a high temperature or a high electric field as to destroy polarization, it is necessary to provide a separate process for polarization.

Figure 4A:
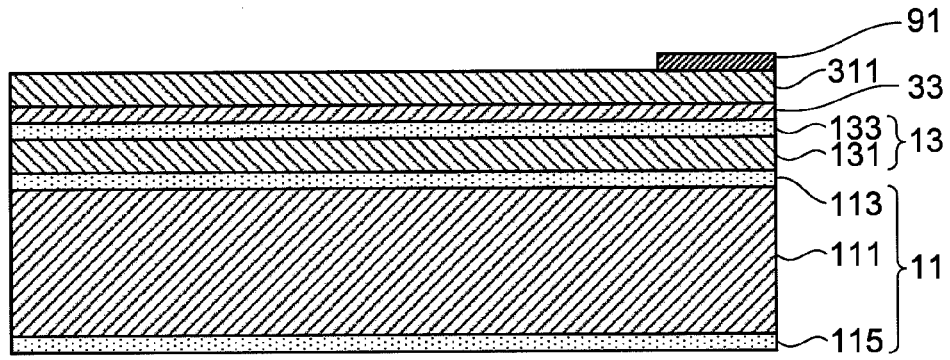
FIG. 4(a) to FIG. 4(c) are sectional views showing a sequence of fabrication steps of the electromechanical transducer.

In FIG. 4(a), the SOI plate having the piezoelectric material film 311 formed on it is cooled down to room temperature; then a photosensitive resin material is applied by spin-coating, it is then exposed to light through a mask by photolithography, and the unnecessary part of it is then removed by etching. In this way, an upper electrode mask 91 is formed to which the shape of the upper electrode 35 and the upper electrode extended section 35a have been transferred.

Figure 4B:
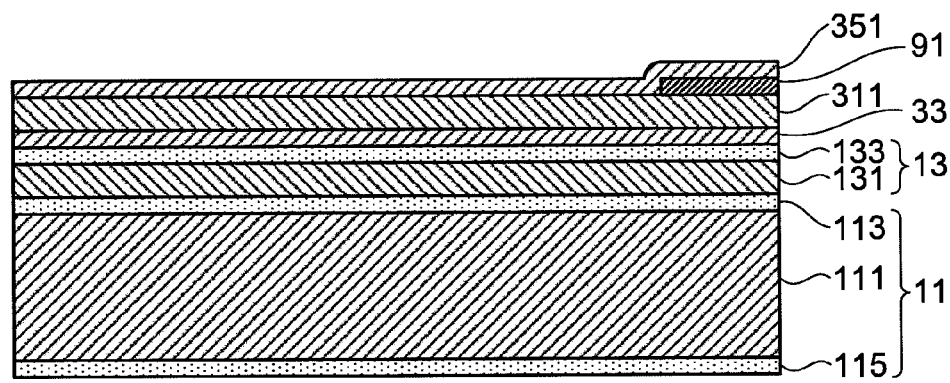

In FIG. 4(b), all over the surface of the SOI plate, an electrode layer 351, which later becomes the upper electrode 35, is formed by sputtering. The electrode layer 351 is composed of a thin titanium Ti layer with a thickness of about 0.02 μm and a platinum Pt layer with a thickness of about 0.2 μm. The titanium layer functions as an adhesion layer for enhancing the adhesion between the piezoelectric material film 311 at one end and the upper electrode 35 and the upper electrode extended section 35a at the other end.

Figure 4C:
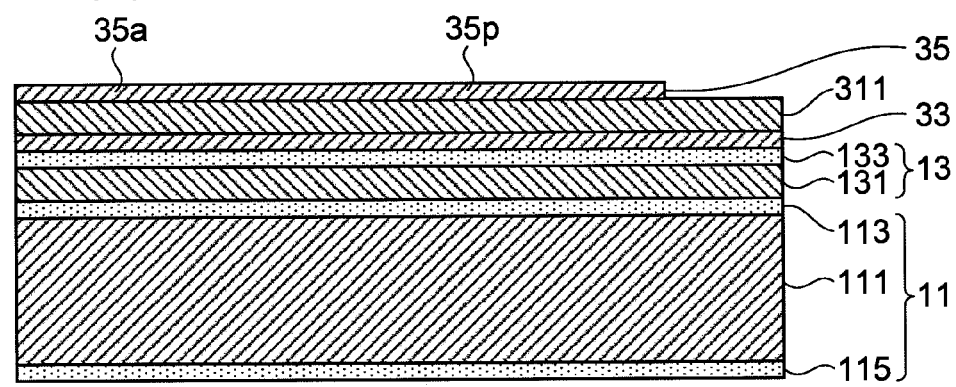

In FIG. 4(c), the upper electrode mask 91 is removed by etching, and the unnecessary part of the electrode layer 351 is removed together, so that the operation section 35p and the upper electrode extended section 35a of the upper electrode 35 are formed.

Figure 5A:
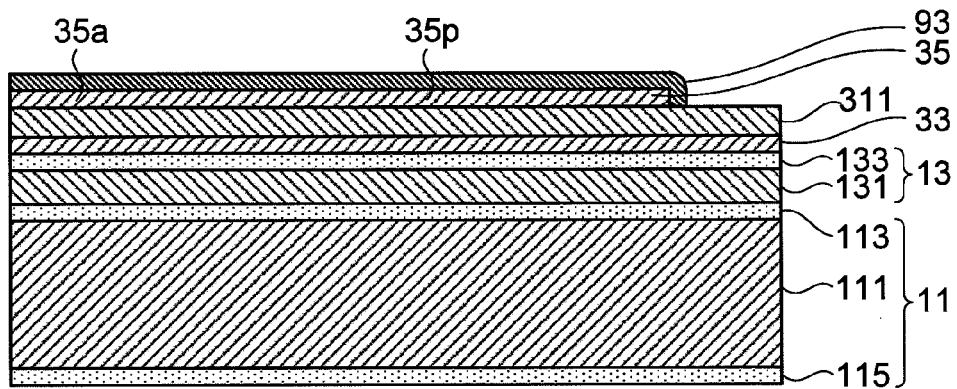
FIG. 5(a) to FIG. 5(c) are sectional views showing a sequence of fabrication steps of the electromechanical transducer.

In FIG. 5(a), a photosensitive resin material is applied by spin-coating, it is exposed to light through a mask by photolithography, and the unnecessary part of it is removed by etching. In this way, a piezoelectric element mask 93 is formed to which the shape of the operation section 31p and the dielectric member extension portion 31a of the piezoelectric member 31 have been transferred.

Figure 5B:
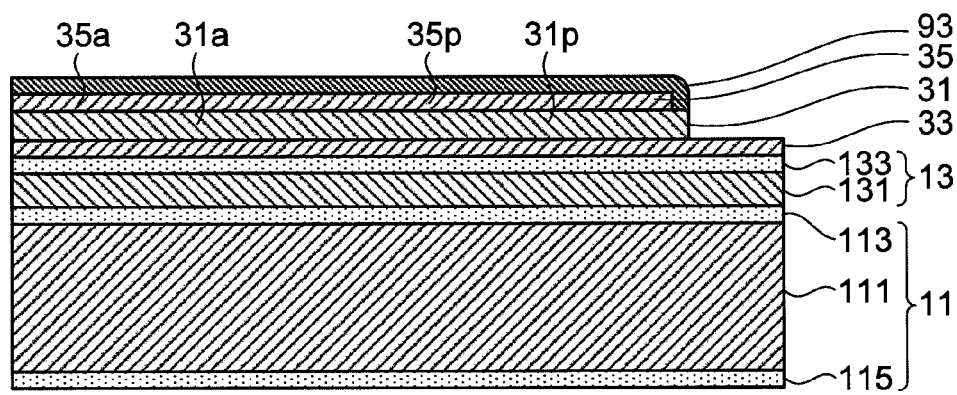
Figure 5C:
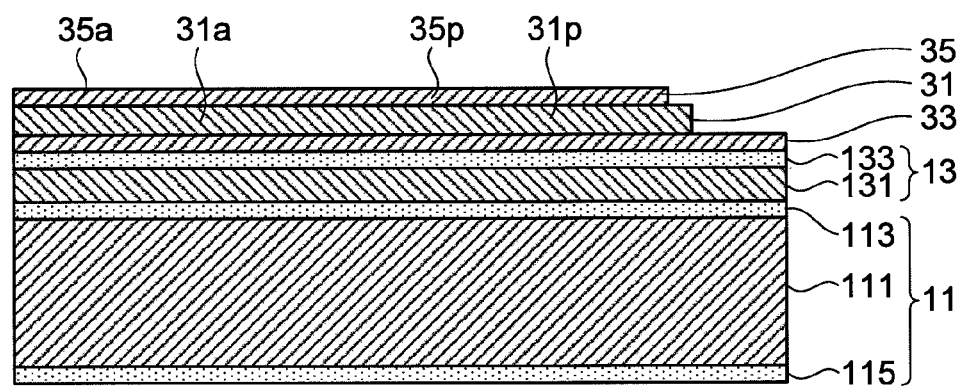

In FIG. 5(b), with the piezoelectric element mask 93 as resist, by reactive ion etching, the shape of the piezoelectric material film 311 is so proceed as to form the operation section 31p and the piezoelectric member extended section 31a of the piezoelectric member 31. In FIG. 5(c), the piezoelectric element mask 93 is removed.

Figure 6A:
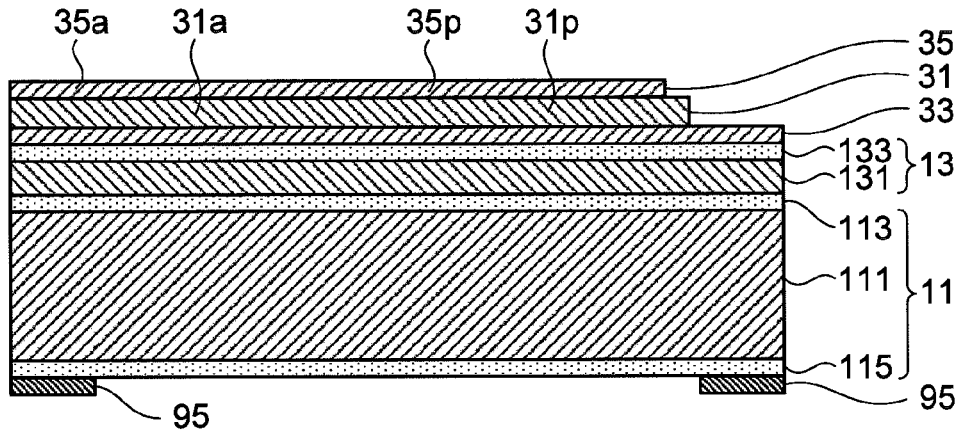
FIG. 6(a) to FIG. 6(c) are sectional views showing a sequence of fabrication steps of the electromechanical transducer.

In FIG. 6(a), on the bottom face of the SOI plate, a photosensitive resin material is applied by spin-coating, it is exposed to light through a mask by photolithography, and the unnecessary part of it is removed by etching. In this way, a pressurizing chamber mask 95 is formed to which the shape of the pressurizing chamber 21 and the side-chamber 23 are transferred.

Figure 6B:
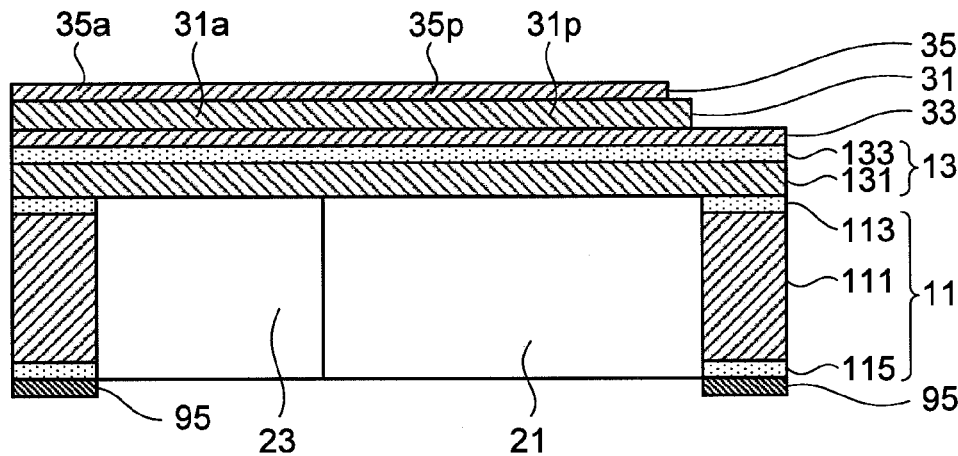

In FIG. 6(b), with the pressurizing chamber mask 95 as resist, by reactive ion etching, the oxide film ($SiO_2$) 115, the Si plate portion 111, and the oxide film ($SiO_2$) 113 are removed. Here, the hardly etchable oxide film ($SiO_2$) 113 functions as an etching stop layer, and thereby helps stabilize the thickness of the driven film 13.

Figure 6C:
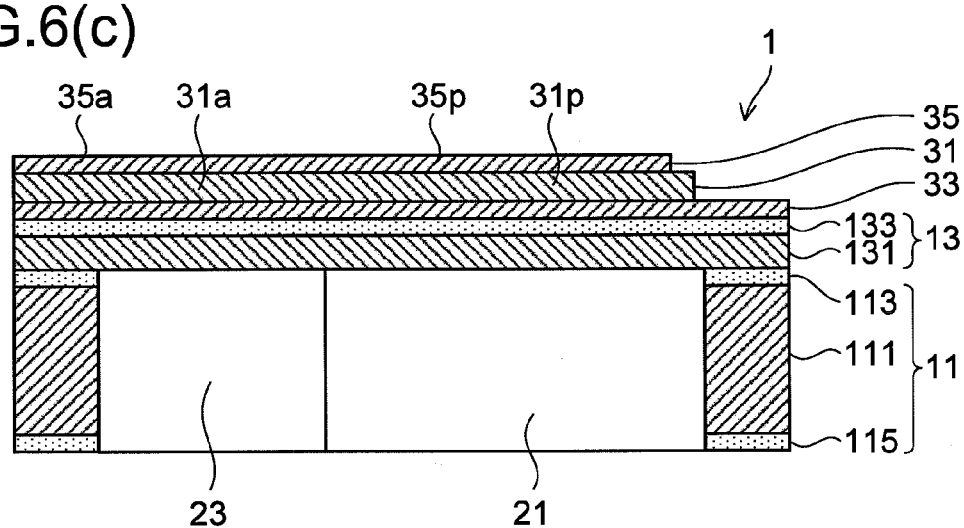

In FIG. 6(c), the pressurizing chamber mask 95 is removed, and this completes the fabrication of the elctromechanical transducer 1.

As described above, according to the first embodiment, it is possible to provide an electromechanical transducer that allows wiring to be led out from the upper electrode while preventing damage to the extended section of the piezoelectric member and the upper electrode and retaining the displacement of the driving film over the pressurizing chamber.

Now, a first application example of the electromechanical transducer according to the first embodiment will be described. The first application example deals with a transmitter/receiver element in an ultrasound probe for medical imaging.

Conventional transmitter/receiver elements in ultrasound probes employ bulk-sintered inorganic piezoelectric materials such as PZT in a form cut longitudinally and laterally. However, being bulk materials, those materials, though having high rigidity and generating strong forces, produce small displacements and hence have low sensitivity. Also, to increase the density of sensor portions, wiring is laid in a form stacked on a piezoelectric material, and this may lead to the problem of ultrasonic vibration being attenuated or modulated depending on the rigidity of the wiring.

As a solution, a plurality of elctromechanical transducers like the one 1 shown in FIG. 1 arranged in a two-dimensional array on a plate are used as a transmitter-receiver element of an ultrasonic probe.

Transmission of ultrasound is achieved by applying between the upper and lower electrodes 35 and 33 an alternating-current voltage of a frequency corresponding to the frequency of the ultrasound to be transmitted.

During reception, the ultrasound reflected from the imaging target enters the pressurizing chamber 21 of the elctromechanical transducer 1 and makes the driven film 13 and the driving film 30 over the wall surface 21a at the top of the pressurizing chamber 21 vibrate so that the piezoelectric effect resulting from the vibration produces an electric field in the operation section 31p of the piezoelectric member 31.

By detecting via the lower and upper electrodes 33 and 35 the amplitude, period, and phase of the electric field occurring in the operation section 31p of all the piezoelectric member 31 arranged in a two-dimensional array, it is possible to obtain a two-dimensional ultrasound image, and thus it is possible to make the elctromechanical transducer 1 function as a receiver element of an ultrasonic probe.

With the elctromechanical transducer 1 according to this embodiment, when ultrasound is transmitted or received, the driving film 30 is not hampered from vibrating, and thus high transmission/reception performance is obtained.

As described above, by employing as a transmitter/receiver element in an ultrasonic probe a plurality of electromechanical transducers 1 according to the first embodiment arranged in a two-dimensional array on a plate, it is possible to achieve high transmission/reception performance.

For use as a transmitter/receiver element in an ultrasonic probe, instead of the piezoelectric member 31, a flexible high-polymer layer may be provided so that the electrostatic force between the lower and upper electrodes 33 and 35 is used as the driving force for the driving film 30. In this case, the high-polymer layer serves as a driving member.

Figure 7A:
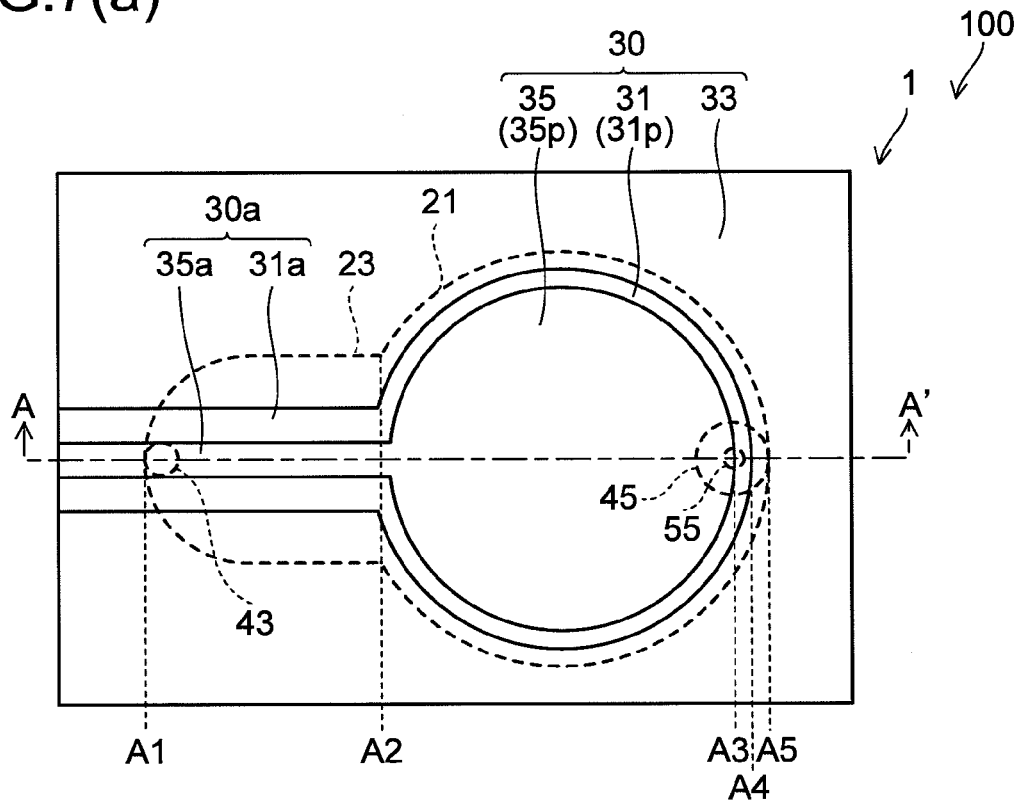
FIG. 7(a) is a plan view showing the structure of an ink-jet printer head as an application example of the electromechanical transducer.
Figure 7B:
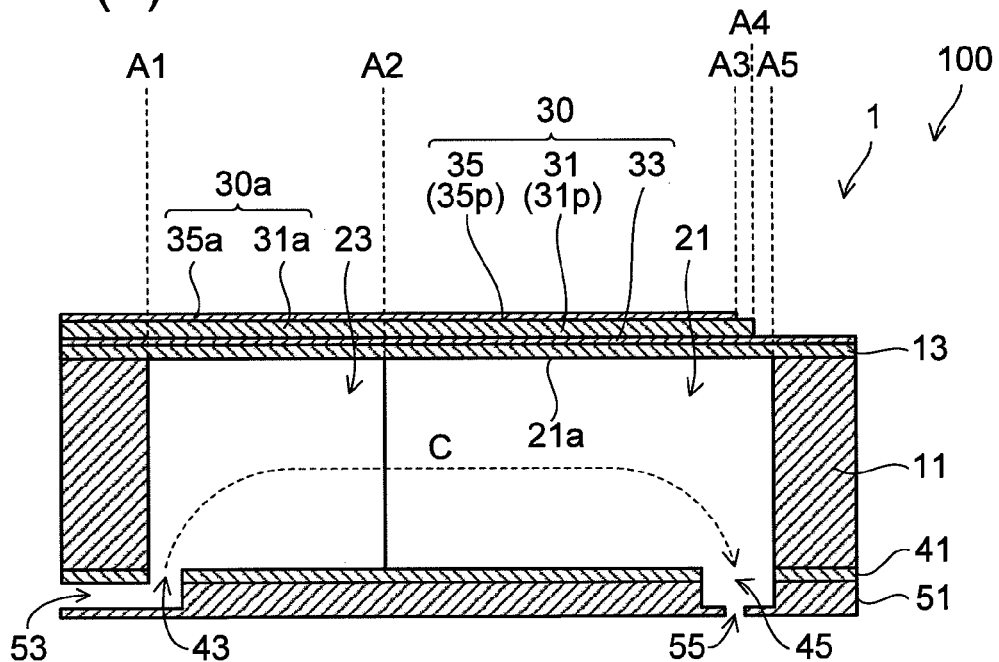
FIG. 7(b) is a sectional view along line A-A' in FIG. 7(a)

Next, a second application example of the electromechanical transducer according to the first embodiment described above will be described with reference to FIG. 7. FIG. 7 is a schematic diagram showing the second application example of the electromechanical transducer according to the first embodiment, FIG. 7(a) being a plan view and FIG. 7(b) being a sectional view along line A-A' in FIG. 7(a). The second application example deals with an ink-jet printer head. In a similar manner, it can be applied to micropumps for other than ink-jet printers.

As shown in FIG. 7, in the ink-jet printer head 100, on the face of the elctromechanical transducer 1 opposite from the driven film 13, a communication plate 41 and a nozzle plate 51 are provided.

The communication plate 41 and the nozzle plate 51 are formed of, for example, Si, a photosensitive resin, a sheet of stainless steel, etc. Their thicknesses are generally from about 50 μm to about 500 μm.

In the communication plate 41, at a position facing an end part of the side-chamber 23, an ink entry 43 is provided and, at a position facing an end part of the pressurizing chamber 21, a nozzle communication port 45 is provided. To the ink entry 43, ink is supplied from an unillustrated ink tank through an ink passage 53 provided in the nozzle plate 51. The supplied ink flows as indicated by arrow C in the figure so as to be jetted out, via the nozzle communication port 45, through an ink jet nozzle 55 provided in the nozzle plate 51. The aperture diameters of the ink entry 43 and the ink-jet nozzle 55 are generally from about 10 µm to about 100 µm.

With this structure, the pressure applied by the driving film 30 to the pressurizing chamber 21 efficiently acts on the ink inside the pressurizing chamber 21, and makes the ink jet out through the ink-jet nozzle 55. On the other hand, since the ink entry 43 is provided on the side-chamber 23 side, it is not subjected to concentration of the pressure in the pressurizing chamber 21. This ensures smooth supply of ink.

Moreover, owing to the ink entry 43 and the ink-jet nozzle 55 being arranged respectively at a position facing on an end part of the side-chamber 23 and at a position facing on an end part of the pressurizing chamber 21, it is possible to prevent bubbles from collecting in corners of the side-chamber 23 and the pressurizing chamber 21, and thus to ensure smooth filling with ink.

Figure 8A:
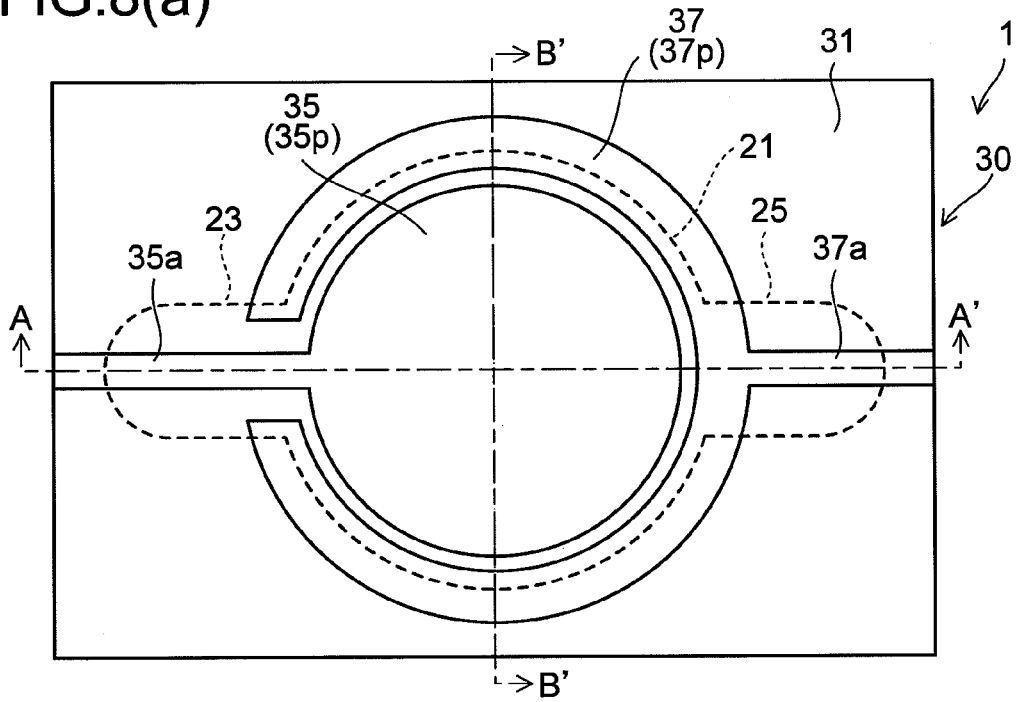
FIG. 8(a) is a plan view showing the structure of an electromechanical transducer according to a second embodiment of the invention.
Figure 8B:
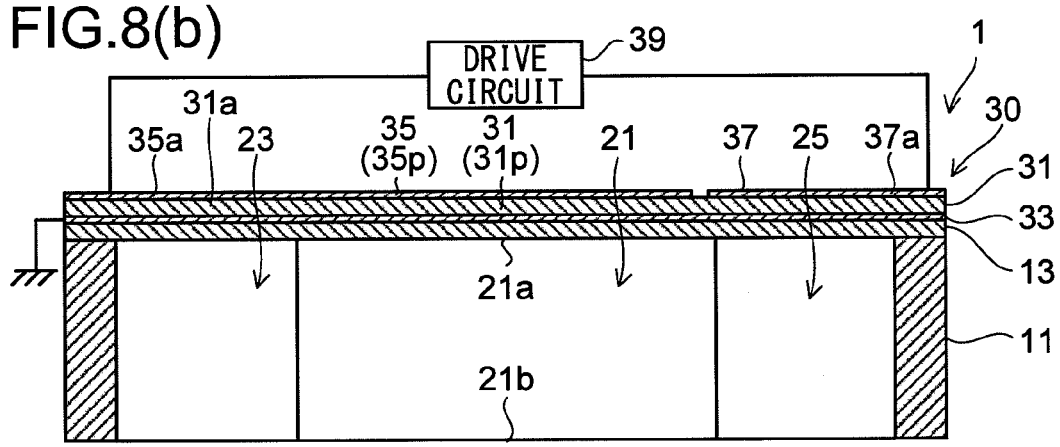
FIG. 8(b) is a sectional view along line A-A' in FIG. 8(a) as seen from the direction indicated by arrows.
Figure 8C:
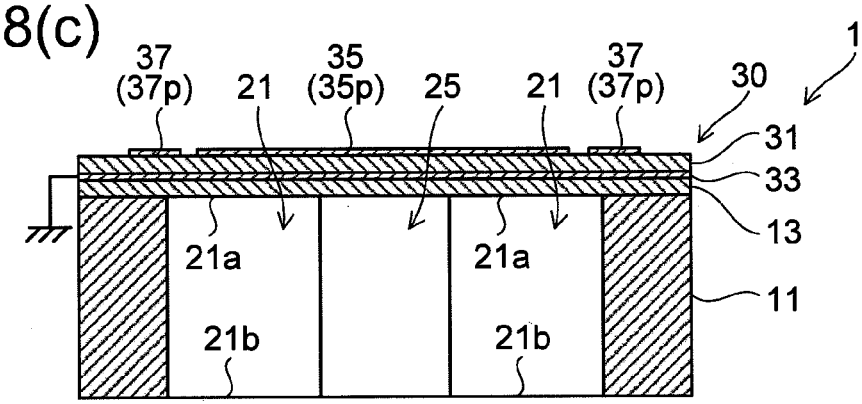
FIG. 8(c) is a sectional view along line B-B' in FIG. 8(a) as seen from the direction indicated by arrows.
Figure 9A:
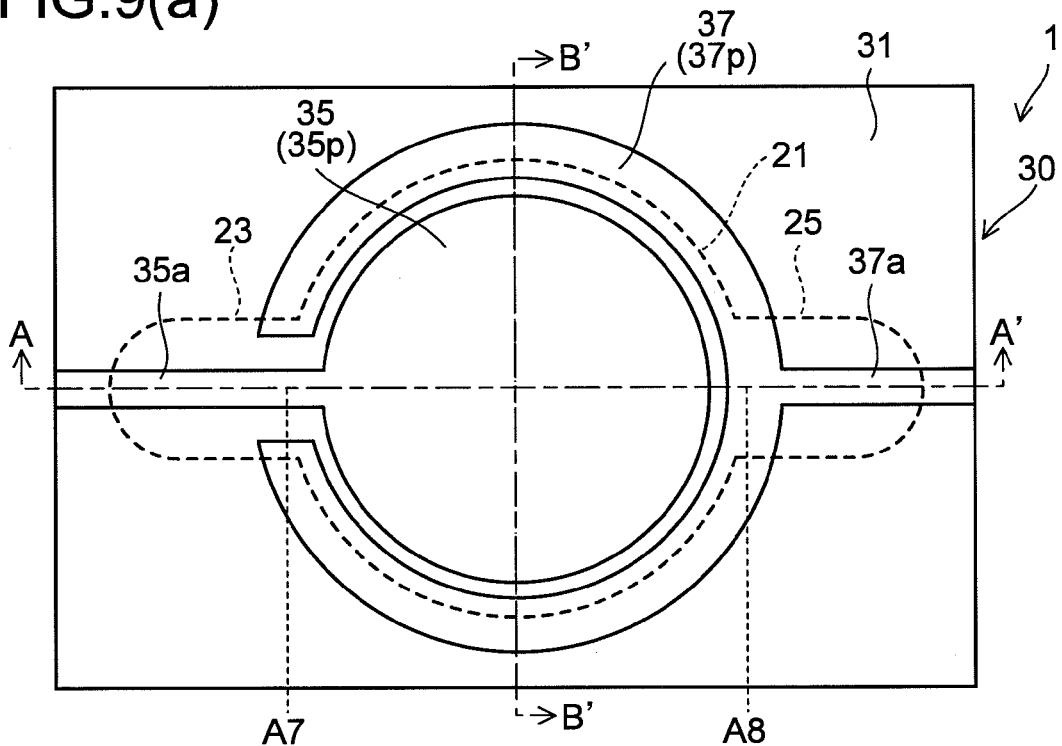
FIG. 9(a) is a plan view of the electromechanical transducer.
Figure 9B:
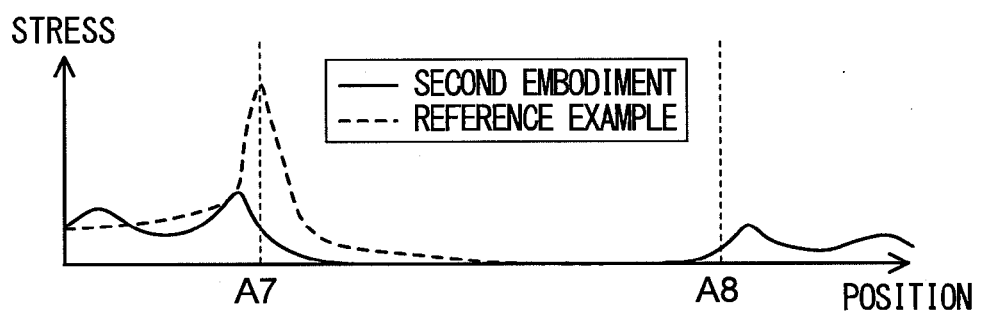
FIG. 9(b) is a plot showing the relationship between position and stress in the electromechanical transducer.
Figure 9C:
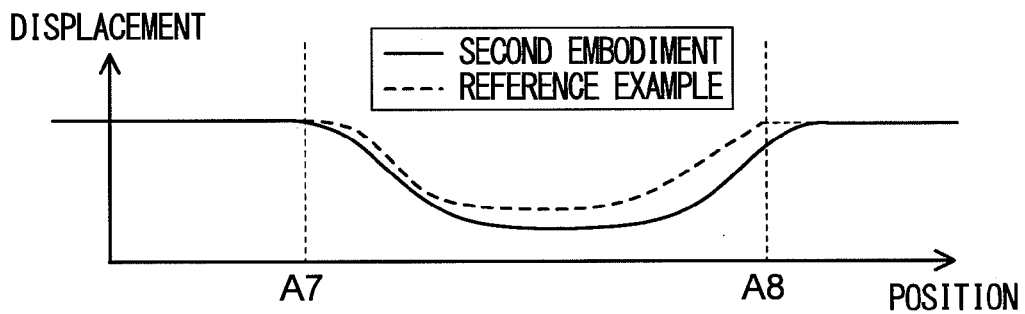
FIG. 9(c) is a plot showing the relationship between position and displacement in the electromechanical transducer.

Next, an electromechanical transducer according to a second embodiment of the invention will be described with reference to FIGS. 8 and 9. FIG. 8 is a schematic diagram showing the structure of the electromechanical transducer according the second embodiment, FIG. 8(a) being a plan view, FIG. 8(b) being a sectional view along line A-A' in FIG. 8(a), and FIG. 8(c) being a sectional view along line B-B' in FIG. 8(a). FIG. 9 is a schematic diagram showing the characteristic curve of the electromechanical transducer according to the second embodiment, FIG. 9(a) being the same plan view as FIG. 8(a), FIG. 9(b) being a plot of the stress occurring during driving, and FIG. 9(c) being a plot of the displacement during driving. Positions A7 and A8 in the plan view correspond respectively to positions A7 and A8 in the sectional view.

As shown in FIG. 8, in the second embodiment, unlike in the first embodiment, the piezoelectric member 31 is, like the driven film 13 and the lower electrode 33, provided all over the top face of the plate 11. Moreover, at a position opposite the side-chamber 23 (a first side-chamber) across the pressurizing chamber 21, a secondary side-chamber 25 (second side-chamber) is provided which is shaped identically with (symmetrically, across the pressurizing chamber 21, with) the side-chamber 23. Preferred ranges of the width and length of the secondary side-chamber 25 are similar to those for the side-chamber 23 described previously.

The upper electrode 35 has, as in the first embodiment, an operation section 35p located over the pressurizing chamber 21 and an upper electrode extended section 35a. The shape of and the preferred ranges of the dimensions of the operation section 35p and the upper electrode extended section 35a of the upper electrode 35 are also similar to those in the first embodiment described previously. Accordingly, it is preferable that the width of the upper electrode extended section 35a be 10% to 40% of the width of the side-chamber 23. As to the shape of the operation section 35p of the upper electrode 35, the shape of the operation section 31p of the piezoelectric member 31 as described in connection with the first embodiment may be adopted.

Furthermore, a second upper electrode 37 is formed which has a C-shaped operation section 37p. The operation section 37p is formed on the piezoelectric member 31 so as to surround the operation section 35p of the upper electrode 35 and overlap the rim of the pressurizing chamber 21. The second upper electrode 37 has a second upper electrode extended section 37a which extends from the C-shaped operation section 37p to over the piezoelectric member 31 over the secondary side-chamber 25, and is led out to over the plate 11 by the second upper electrode extended section 37a. The width of the second upper electrode extended section 37a is smaller than the width of the secondary side-chamber 25, and its preferred range is similar to that for the upper electrode extended section 35a. Specifically, it is preferable that the width of the second upper electrode extended section 37a be 10% to 40% of the width of the secondary side-chamber 25. In other respects in structure and with respect to the fabrication method, the same description applies here as with the first embodiment, and therefore no overlapping description will be repeated.

In a case where, as in the second embodiment, the piezoelectric member 31 is provided all over the top face of the plate 11, even when a voltage is applied between the upper and lower electrodes 35 and 33 with the intention to make only the piezoelectric member 31 over the pressurizing chamber 21 expand and contract, the piezoelectric member 31 around it may resist and hamper the piezoelectric member 31 over the pressurizing chamber 21 from expanding and contracting.

As a solution, in the second embodiment, from a drive circuit 39 to which the upper electrode 35 and the second upper electrode 37 are connected, a drive signal of the opposite polarity to that fed to the upper electrode 35 is fed to the second upper electrode 37. That is, driving proceeds such that when the piezoelectric member 31 under the upper electrode 35 expands, the piezoelectric member 31 under the second upper electrode 37 contracts and, when the piezoelectric member 31 under the upper electrode 35 contracts, the piezoelectric member 31 under the second upper electrode 37 expands. In this way, only the operation section 31p of the piezoelectric member 31 over the pressurizing chamber 21 can be made to expand and contract. This helps increase the displacement of the operation section 31p of the piezoelectric member 31 over the pressurizing chamber 21.

In FIG. 9(b), the stress occurring in the piezoelectric member 31 over the side-chamber 23, the pressurizing chamber 21, and the secondary side-chamber 25 is indicated by a solid line. There, the stress in the reference example shown in FIG. 12(b) is indicated by a broken line. It is revealed that, as in the first embodiment, stress spreads across all over the side-chamber 23, the pressurizing chamber 21, and the secondary side-chamber 25 without concentrating as in the reference example and is thereby greatly reduced.

In FIG. 9(c), a plot of the displacement of the piezoelectric member 31 over the pressurizing chamber 21 is indicated by a solid line. It is revealed that the displacement is increased compared with that, indicated by a broken line, in the elctromechanical transducer 1 of the reference example shown in FIG. 12(c).

According to the second embodiment, it is possible to provide an electromechanical transducer that allows wiring to be led out from the upper electrode while preventing damage to the extended section of the piezoelectric member and the upper electrode and retaining the displacement of the driving film over the pressurizing chamber.

Now, a first application example of the electromechanical transducer according to the second embodiment described above will be described. The first application example here, like that according to the first embodiment, deals with a transmitter/receiver element in an ultrasonic probe for medical imaging.

Here, as in the first embodiment, a plurality of electromechanical transducers like the one 1 shown in FIG. 8 arranged in a two-dimensional array is used as a transmitter/receiver element in an ultrasonic probe.

Transmission of ultrasound is achieved by applying between the upper electrode 35 and the lower electrode 33 an alternating-current voltage of a frequency corresponding to the frequency of the ultrasound to be transmitted and in addition applying between the second upper electrode 37 and the lower electrode 33 an alternating-current voltage of the opposite polarity.

During reception, the ultrasound reflected from the imaging target enters the pressurizing chamber 21 in the elctromechanical transducer 1 and makes vibrate the driven film 13 and the driving film 30 over the wall surface 21a at the top of the pressurizing chamber 21. Here, the driven film 13 and the driving film 30 curve in an S-shape; thus, central and peripheral parts of the piezoelectric member 31 over the pressurizing chamber 21 curve in opposite directions; that is, while one expands, the other contracts. Thus, through the piezoelectric effect, voltages of opposite polarities appear. By detecting these voltages of opposite polarities at the upper electrode 35 and the second upper electrode 37 and taking their difference, it is possible to increase the output voltage as compared with detecting a voltage at the upper electrode 35 alone. This helps improve the S/N ratio and obtain higher performance.

Figure 10A:
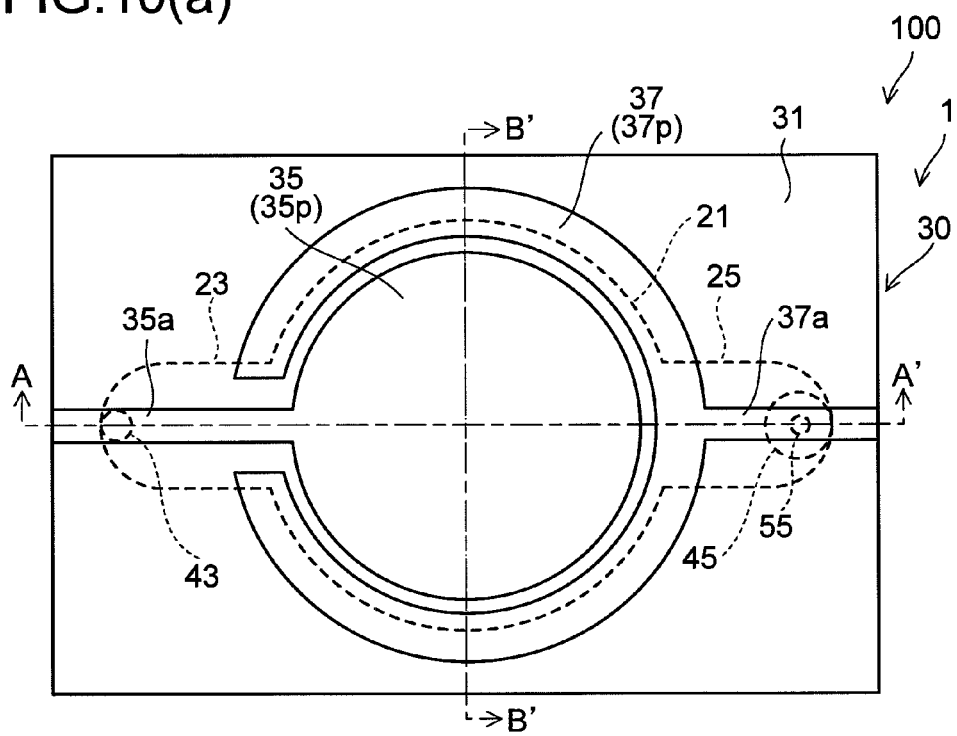
FIG. 10(a) is a plan view showing the structure of an ink-jet printer head as an application example of the electromechanical transducer.
Figure 10B:
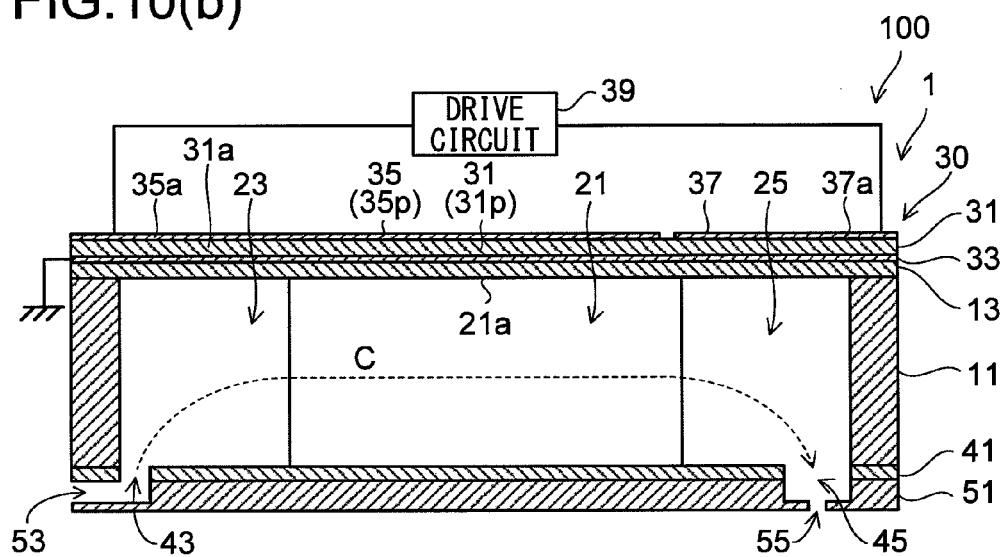
FIG. 10(b) is a sectional view along line A-A' in FIG. 10(a)

Next, a second application example of the electromechanical transducer according to the second embodiment will be described with reference to FIG. 10. FIG. 10 is a schematic diagram showing the second application example of the electromechanical transducer according to the second embodiment. The second application example here, like that according to the first embodiment, deals with an ink-jet printer head.

The example in FIG. 10 differs from the example in FIG. 7 in that the nozzle communication port 45 and the ink-jet nozzle 55 are proved not under the pressurizing chamber 21 but under an end part of the secondary side-chamber 25. In this way, like the ink entry 43, the ink-jet nozzle 55 can also be arranged away from the pressurizing chamber 21 so as not to be subjected to concentration of the pressure in the pressurizing chamber 21. This ensures smooth flow of ink. In other respects, the second application example here is the same as that according to the first embodiment shown in FIG. 7, and therefore no overlapping description will be repeated.

It should be understood that many modifications and variations are possible in the details of the structure and operation of the electromechanical transducers presented as embodiments above without departing from the spirit of the present invention.

INDUSTRIAL APPLICABILITY

Electromechanical transducers according to the present invention find applications, for example, in transmitter/receiver elements in ultrasonic probes, and in ink-jet printer heads.

LIST OF REFERENCE SIGNS 1 electromechanical transducer
11 plate
13 driven film
21 pressurizing chamber
21a wall surface
23 side-chamber (first side-chamber)
25 secondary side-chamber (second side-chamber)
30 driving film
30a extended section
31 piezoelectric member (driving member)
31a dielectric member extended section
31p operation section
33 lower electrode
35 upper electrode (first upper electrode)
35a upper electrode extended section (first electrode extended section)
35p operation section (first electrode operation section)
37 second upper electrode
37a second upper electrode extended section (second electrode extended section)
37p operation section (second electrode operation section)
39 drive circuit
41 communication plate
43 ink entry
45 nozzle communication port
51 nozzle plate
53 ink passage
55 ink-jet nozzle
100 ink-jet printer head

The invention claimed is:

1. An electromechanical transducer comprising:
a plate including:
(i) a pressurizing chamber, a cross section of which has substantially the same lengths in a first direction and a second direction, the first direction being on a plane parallel to the surface of the plate and the second direction being perpendicular to the first direction and on the plane, and
(ii) a side-chamber arranged adjacent to the pressurizing chamber in a first direction and combined with the pressurizing chamber to form a space in the plate;
a driven film formed on a surface of the plate, the driven film being thinner than the plate and covering the pressurizing chamber and the side-chamber;
a lower electrode formed on the driven film;
a driving member, having an outline smaller than the cross section of the pressurizing chamber in the direction parallel to the surface of the plate, in a first area opposite to the pressurizing chamber with respect to the lower electrode, including
an operation section formed on the first area, and
an extended section extended from the operation section to a second area opposite to the side-chamber with respect to the lower electrode; and
an upper electrode formed on the driving member,
wherein the length of the side-chamber in the second direction is smaller than the length of the pressurizing chamber in the second direction; and
wherein the length of the extended section of the driving member in the second direction is smaller than the length of the side-chamber in the second direction.

2. The electromechanical transducer of claim 1, wherein the length of the upper electrode formed on the extended section of the driving member in the second direction is smaller than the length of the extended section of the driving member in the second direction.

3. The electromechanical transducer of claim 1, wherein the length of the side-chamber in the second direction is no less than 25% and no more than 75% of the length of the pressurizing chamber in the second direction.

4. The electromechanical transducer of claim 1, wherein the length of the extended section of the driving member is no less than 50% and no more than 80% of the length of the side-chamber in the second direction.

5. The electromechanical transducer of claim 1, wherein the operation section of the driving member on a plane parallel to the plate is circular.

6. The electromechanical transducer of claim 1, wherein the cross section of the pressurizing chamber in a direction parallel to the plate is circular, rectangular or polygonal and the side-chamber is a part of the space formed in the plate other than the space of the pressurizing chamber.

7. The electromechanical transducer of claim 1, wherein the driving member is a piezoelectric body.

8. An inkjet head for an inkjet printer comprising:
the electromechanical transducer of claim 1; and
a nozzle plate combined with a surface of the electromechanical transducer, the surface being opposite to the driving member with respect to the plate, the nozzle plate having an ink entry provided near an outer edge of the side-chamber, the ink entry through which an ink inflows into the side-chamber, and
an inkjet nozzle provided near an outer edge of the pressurizing chamber, the inkjet nozzle through which the ink is discharged from the pressurizing chamber.

9. An electromechanical transducer comprising:
a plate including:
   (i) a pressurizing chamber, a cross section of which has substantially the same lengths in a first direction and a second direction, the first direction being on a plane parallel to a surface of the plate and the second direction being perpendicular to the first direction and on the plane,
   (ii) a first side-chamber arranged adjacent to the pressurizing chamber in the first direction and combined with the pressurizing chamber to form a space in the plate, and
   (iii) a second side-chamber arranged adjacent to the pressurizing chamber and opposite to the first side-chamber with respect to the pressurizing chamber and combined with the pressurizing chamber to form the space in the plate;
a driven film formed on a surface of the plate, the driven film being thinner than the plate and covering the pressurizing chamber, the first side-chamber and the second side-chamber;
a lower electrode formed on the driven film;
a driving member formed on the lower electrode;
a first upper electrode formed on the driving member, the first upper electrode including a first electrode operation section formed at a position opposite to the pressurizing chamber with respect to the driving member, the first electrode operation section being smaller than the cross section of the pressurizing chamber in the direction parallel to a surface of the plate, the first electrode operation section having substantially the same length in the first direction as it has in the second direction;
a first extended electrode extended from the first electrode operation section to an area opposite to the first side-chamber with respect to the driving member;
a second upper electrode formed on the driving member, the second upper electrode including a second electrode operation section formed at a position opposite to the pressurizing chamber with respect to the driving member, the second electrode operation section being provided to overlap a margin of the pressurizing chamber and surround the first electrode operation section of the first upper electrode when viewed in a direction perpendicular to the surface of the plate;
a second extended electrode extended from the second electrode operation section to an area opposite to the second side-chamber with respect to the driving member; and
a driving circuit configured to send driving signals with opposite polarities to the first upper electrode and to the second upper electrode,
wherein the length of the first side-chamber and the length of the second side-chamber in the second direction is smaller than the length of the pressurizing chamber in the second direction, respectively, and
wherein the length of the first extended section of the first upper electrode and the length of the second extended section of the second upper electrode in the second direction are smaller than the lengths of the first side-chamber and the second side-chamber in the second direction, respectively.

10. The electromechanical transducer of claim 9, wherein the length of the first side-chamber and the length of the second side-chamber in the second direction is no less than 25% and no more than 75% of the length of the pressurizing chamber in the second direction, respectively.

11. The electromechanical transducer of claim 9, wherein the length of the first extended section of the first electrode is no less than 10% and no more than 40% of the length of the first side-chamber in the second direction, and the length of the second extended section of the second electrode is no less than 10% and no more than 40% of the length of the second side-chamber in the second direction.

12. The electromechanical transducer of claim 9, wherein the operation section of the driving member in a plane parallel to the plate is circular.

13. The electromechanical transducer of claim 9, wherein the cross section of the pressurizing chamber in a direction parallel to the plate is circular, rectangular or polygonal and the first side-chamber and the second side-chamber are parts of the space formed in the plate other than a space of the pressurizing chamber, the parts being arranged opposite to each other with respect to the pressurizing chamber.

14. The electromechanical transducer of claim 9, wherein the driving member is a piezoelectric body.

15. An inkjet head for an inkjet printer, comprising:
the electromechanical transducer of claim 9;
a nozzle plate combined with a surface of the electromechanical transducer, the surface being opposite to the driving member with respect to the plate, the nozzle plate having an ink entry provided near an outer edge of the first side chamber, the ink entry through which an ink inflows into the first side-chamber; and
an ink jet nozzle provided near an outer edge of the second side-chamber, the ink jet nozzle through which the ink is discharged from the second side-chamber.

* * * * *